Oct. 8, 1968 A. GEE 3,405,017
USE OF ORGANOSILICON SUBBING LAYER IN PHOTORESIST METHOD FOR OBTAINING FINE PATTERNS FOR MICROCIRCUITRY
Filed Feb. 26, 1965
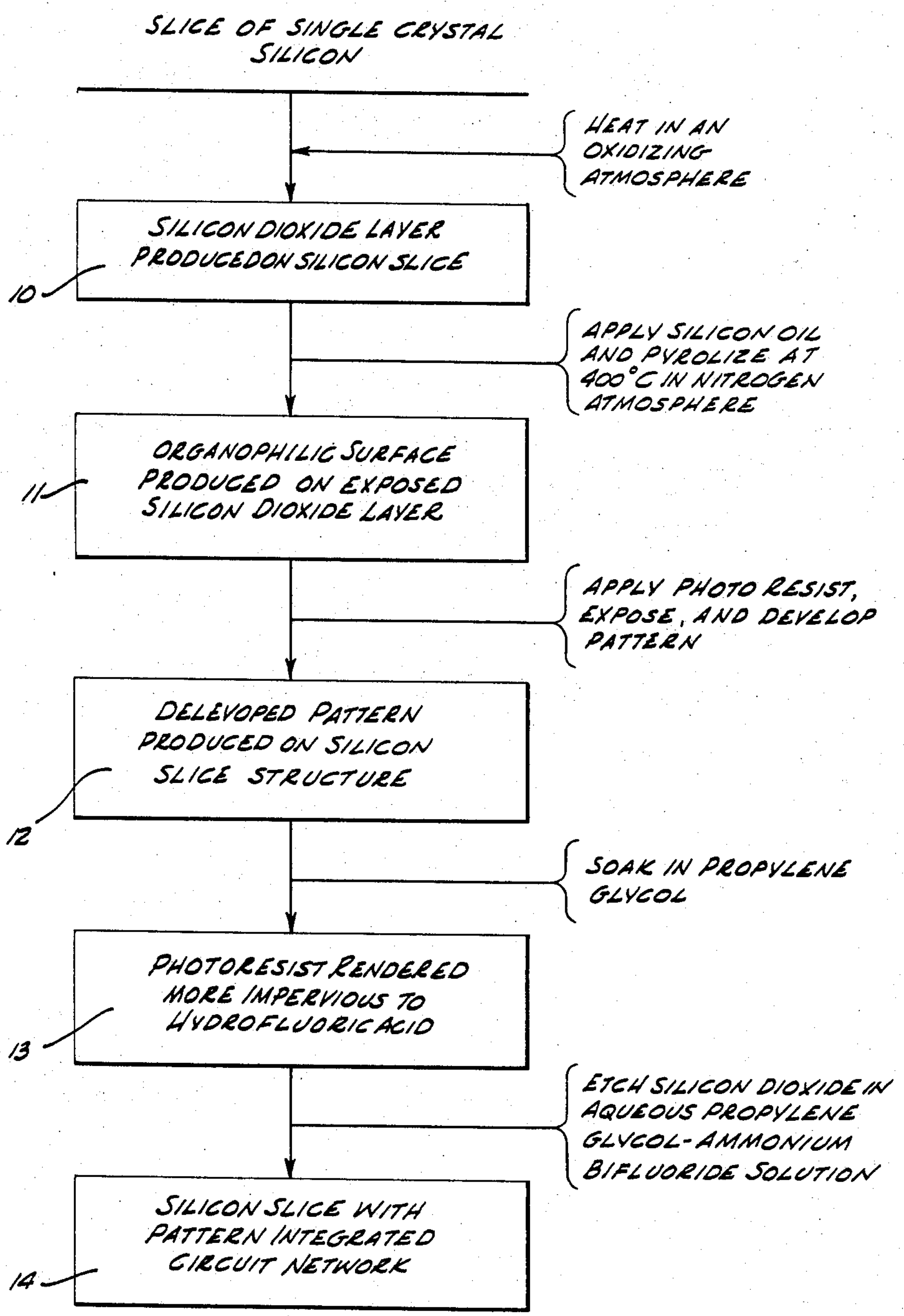
INVENTOR
ALLEN GEE,
BY
John M. Koch
ATTORNEY.

3,405,017
Patented Oct. 8, 1968

3,405,017

USE OF ORGANOSILICON SUBBING LAYER IN PHOTORESIST METHOD FOR OBTAINING FINE PATTERNS FOR MICROCIRCUITRY

Allen Gee, Newport Beach, Calif., assignor to Hughes Aircraft Company, Culver City, Calif., a corporation of Delaware Filed Feb. 26, 1965, Ser. No. 435,517
6 Claims. (Cl. 156—17)

ABSTRACT OF THE DISCLOSURE

This invention relates to improved new and alternative photoresist method and modification thereof for obtaining fine patterns as in integrated circuit fabrication. Preferably an organophilic surface is initially produced upon a clean or oxide-coated substrate before it is subjected to photoresist processing. By using this organophilic layer, the photoresist withstands much longer etching periods so that deeper, sharper etch patterns are produced with fewer pinholes or other defects. With or without such organophilic layer, additional organic coating protection of the developed pattern, from etchants, is preferably obtained by treating the pattern with a polar organic compound to retard diffusion of the etch solution into the pattern through the developed photoresist film.

This invention relates to a photoresist method for obtaining fine patterns for integrated circuit fabrication.

A standard technique employed for this process includes the application of photoresist to a clean substrate surface, or an oxidized surface, such as an oxidized surface of silicon, for example, exposing the resulting assembly to actinic light to obtain a desired exposure under a photographic mask with an extremely well-resolved dark pattern, such as that of an array of channels to divide each area for each integrated circuit into a network of small plots inside of which the various circuit components will be built during successive fabrication steps, developing the resulting pattern in accordance with instructions for the particular photoresist employed and etching the substrate with a suitable etching solution, such as hydrofluoric acid etch for silicon substrates. After etching, the photoresist is thoroughly removed by a heavy chemical attack that must not affect either the silicon dioxide layer or the silicon substrate surface, for example, bared by the pattern etched into the silicon dioxide.

With ever decreasing size and complexity of the patterns required, it becomes increasingly difficult to etch without detrimentally affecting the photoresist, to obtain patterns of sufficient etching depth and sufficient sharpness and freedom from defects such as pinholes.

Accordingly, it is a primary object of this invention to provide a method for producing suitably fine patterns of high yield by the use of a photoresist etching method for integrated circuit fabrication.

Additional objects of the invention will become apparent from the following description, which is given primarily for purposes of illustration, and not limitation.

Stated in general terms, the objects of the invention are attained by providing a photoresist method for integrated circuit pattern or array production wherein an organophilic surface is produced upon the oxide-coated single crystal substrate before it is subjected to photoresist processing. By the use of this organophilic layer, the photoresist withstands considerably longer etching times, deeper etching can be produced, better, sharper patterns result and fewer pinholes result. The organophilic layer is produced by the decomposition or pyrolysis of a silicone compound such as silicone oil, alkyl silyl chloride, or other organosilicon monomer or polymer.

Additional protection of the developed circuit pattern is accomplished by treating the developed pattern produced on the substrate with an organic compound containing a polar group, such as a hydroxyl group, to retard the diffusion of etch solutions, such as hydrofluoric acid-containing solutions, through the developed photoresist film. Among suitable organic compounds for such protection are propylene glycol, butylene glycol, glycerol, low molecular weight polyethylene glycols, and the like.

A more detailed description of a specific embodiment of the invention is given below with reference to the accompanying drawing, which is a flow sheet illustrating the method of the invention as applied to a single crystal silicon substrate.

A slice of single crystal silicon is provided with a silicon dioxide layer, as indicated at 10. This is accomplished by treating the slice in an oxidizing atmosphere at high temperature in conventional manner. An organophilic surface is then prepared over the silicon dioxide layer by applying thereto a silicone oil, or other organosilicon compound, and pyrolyzing the resulting assembly in a nitrogen atmosphere at about 400° C., as indicated at 11. Alternatively, substrates other than silicon, can be treated with a silicon compound such as trimethyl silyl chloride or other suitable organosilicon compounds to produce the desired organophilic surface in the substrate.

A suitable photoresist then is applied, exposed and developed to produce a pattern in accordance with standard procedures known in the art, as indicated at 12. The resulting structure, with the thus produced pattern is soaked in propylene glycol, for example, as indicated at 13, to produce a photoresist film which is more impervious to hydrofluoric acid-containing etch solutions. Finally, the treated silicon slice is subjected to the action of an etch solution to etch the silicon oxide, as indicated at 14, to produce the desired fine, high resolution network pattern of integrated circuit arrays suitable for component fabrication. A suitable etch solution contains 40% to 60% propylene glycol in water 0–5% hydrofluoric acid and is saturated with ammonium bifluoride. As stated above, a suitable etch solution contains 40 to 60% propylene glycol in water, saturated with ammonium bifluoride, and to which may be added up to 5% hydrofluoric acid. The photoresist composition is known to the art as shown by the Minsk et al. Patents 2,670,286 and 2,670,287 and Cooper et al. 3,193,418.

By the use of the above-described method of the invention, improved yields are obtained and sharper patterns result. Deeper etching can be employed and fewer pinholes are observed.

It will be understood that, although the method of the invention was illustrated and described hereinabove as applied to a single crystal substrate of silicon, it also can be applied to a single crystal substrate of germanium or other suitable semiconductor material by using appropriate modifications, and to many types of films covering a wide range of substrates.

Obviously many other modifications and variations of the present invention are possible in the light of the above teachings. It is therefore to be understood that within the scope of the appended claims the invention can be practiced otherwise than as specifically described.

What is claimed is:

1. In the method of preparing the surface of a crystalline semiconductor substrate for providing an integrated circuit pattern thereon by a photoresist method the steps of coating the said subtrate with an organosilicon compound and effecting the production of an organophilic layer thereof thereon by the decomposition or pyrolysis of said organosilicon compound.

2. The method of claim 1 wherein the silicone compound is selected from the group consisting of silicone oil, alkyl silyl chloride, or other organosilicon monomer or polymer, and mixtures thereof.

3. The method of claim 1 wherein the said coating on said semiconductor is pyrolyzed in a nitrogen atmosphere at about 400° C.

4. The method of claim 1 wherein the said surface is a silicon oxide layer.

5. The method of claim 1 including the steps of applying a photoresist film to the said organophilic layer, exposing the said film to a pattern, developing the exposed pattern, treating the said developed pattern produced on the substrate with an etch resistant organic compound containing a polar group and which retards diffusion of a hydrofluoric acid etch solution through the said developed photoresist film, adding an etching solution and etching the theretofore treated surface to produce the desired pattern.

6. The method of claim 5 wherein the said etch resistant organic compound is selected from the group consisting of propylene glycol, butylene glycol, glycerol, low molecular weight polyethylene glycols, and mixtures thereof.

References Cited

UNITED STATES PATENTS

| | | | |
|---|---|---|---|
| 3,348,987 | 10/1967 | Stark et al. | 156—17 |
| 2,393,875 | 1/1946 | Van Dusen | 101—149.2 |
| 3,193,418 | 7/1965 | Cooper et al. | 148—189 |
| 3,317,320 | 5/1967 | Reber | 96—36.2 |

JACOB H. STEINBERG, *Primary Examiner.*